United States Patent [19]

Kashima et al.

[11] Patent Number: 5,034,955
[45] Date of Patent: Jul. 23, 1991

[54] SUPERLUMINESCENT DIODE

[75] Inventors: Yasumasa Kashima; Masao Kobayashi; Yoji Hosoi; Takashi Tsubota, all of Tokyo, Japan

[73] Assignee: Oki Electric Industry Co., Ltd., Japan

[21] Appl. No.: 441,039

[22] Filed: Nov. 22, 1989

[30] Foreign Application Priority Data

Nov. 30, 1988 [JP] Japan ............................ 63-303544

[51] Int. Cl.$^5$ ................................................ H01S 3/19
[52] U.S. Cl. ...................................... 372/45; 372/46; 372/108; 357/17
[58] Field of Search ................. 372/44, 45, 49, 48, 372/50, 108, 46; 357/17, 16

[56] References Cited

U.S. PATENT DOCUMENTS

| 4,821,276 | 4/1989 | Alphonse et al. | 372/45 |
| 4,821,277 | 4/1989 | Alphonse et al. | 372/45 |
| 4,872,180 | 10/1989 | Rideout et al. | 372/99 |
| 4,888,624 | 12/1989 | Johnston, Jr. et al. | 357/16 |
| 4,901,123 | 2/1990 | Noguchi et al. | 357/17 |

FOREIGN PATENT DOCUMENTS

| 106673 | 5/1987 | Japan | 33/00 |
| 62-142376 | 6/1987 | Japan . | |

OTHER PUBLICATIONS

Imai et al., *Fujitsu Sci. Tech. J.*, 18(4) (Dec. 82) pp. 541-61 "V-Grooved-Substrate Buried Heterostructure ...".
Uchiyama et al., *Jap. J. Appl. Phys.* vol. 21(10, Oct. 82, pp. 1639, "GaIu AsP/InP DH Laser with a Current Blocking ...".
Boeck et al. *Frequent.*, vol. 33(10) (1979), pp. 278-83, "AlGuAs/GaAs Double-Heterostructure Super-...".
"Lateral Confinement InGaAsP Superluminescent Diode at 1.3 um," *IEEE Journal of Quantum Electronics*, vol. QE-19, No. 1, Jan., 1983, pp. 78-81.

*Primary Examiner*—Frank Gonzalez
*Assistant Examiner*—Galen J. Hansen
*Attorney, Agent, or Firm*—Edward D. Manzo

[57] ABSTRACT

A superluminescent diode has an active layer confined in a channel cut into current blocking layers on a semiconductor substrate. This structure gives a small output beam diameter and high coupling efficiency, even when coupled into single-mode fiber. At the end of the channel distant from the output facet, the active layer makes slanting contact with a rough diffusing surface formed by the current blocking layers and substrate. This easily-manufactured diffusing surface reduces optical gain within the active layer, thereby preventing lasing without requiring an antireflection coating.

10 Claims, 4 Drawing Sheets

SUPERLUMINESCENT DIODE

BACKGROUND OF THE INVENTION

This invention relates to a superluminescent diode, more particularly to a superluminescent diode that can be easily fabricated and efficiently coupled into a single-mode optical fiber.

A superluminescent diode is a light source with properties intermediate between those of a light-emitting diode (LED) and laser diode (LD). Superluminescent diodes can be tailored to the requirements of a wide variety of optical systems. They have been used in fiber-optic transmission systems, for example, and for optical pumping of lasers and fiber-optic gyroscope.

Prior-art superluminescent diodes have had a ridge structure, the ridge acting as a waveguide for lateral confinement of light emitted by an active layer underlying the ridge. The output facet of the diode is provided with an antireflection coating of, for example $Si_3N_4$. The opposite facet of the diode is provided with a high-reflectivity mirror coating comprising, for example, a gold layer and an $Si_3N_4$ layer. Spontaneous emission occurring in the active layer is amplified by further stimulated emission on the extended light path within the waveguide, possibly including one mirror reflection. The antireflection coating, however, prevents optical feedback, so the diode does not operate as a laser. Its output is therefore free of the modal, partition, and feedback noise present in laser diode output.

Operating at an ambient temperature of 20° C. with a drive current of 250 mA, a prior-art superluminescent diode of this structure can provide an output power of, for example, 1.9 mW. The output can be coupled into a 50-micron core diameter multi-mode fiber with an efficiency of, for example, 30%.

The coupling efficiency into a single-mode fiber, however, is lower, because the output region at the end of the ridge is too wide in relation to the single-mode fiber core diameter. This makes the prior-art superluminescent diode unsuitable for certain applications, such as in fiber-optic interference sensors. In addition, reliable fabrication of an antireflection coating with the necessary low reflectivity is difficult. Lasing is therefore apt to occur in prior-art superluminescent diodes, due to unavoidable manufacturing variability.

SUMMARY OF THE INVENTION

It is accordingly an object of the present invention to achieve a high coupling efficiency into single-mode fiber.

Another object of the invention is to prevent lasing by means that can be easily fabricated.

A superluminescent diode comprises a semiconductor substrate overlain by at least one blocking layer in which a channel is cut, extending longitudinally from the output facet of the diode for a certain length, and having sufficient depth to penetrate into the semiconductor substrate. Light is emitted from an active layer disposed within the channel. At the end of the channel distant from the output facet, the semiconductor substrate and current blocking layer or layers form a diffusing surface which makes slanting contact with the active layer.

DETAILED DESCRIPTION OF THE EMBODIMENTS

A novel superluminescent diode will be described with reference to FIGS. 1 to 3.

Figure 1:
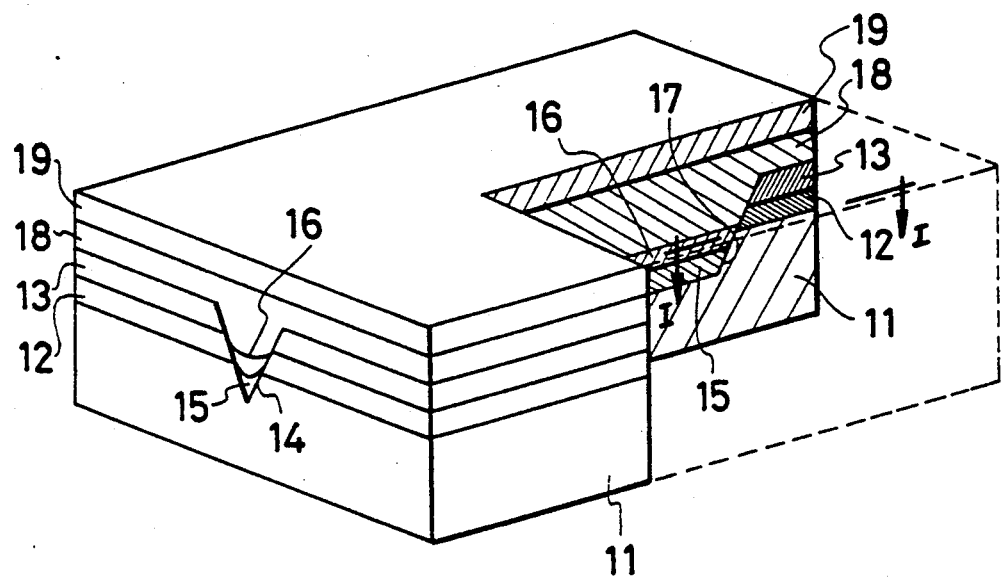
FIG. 1 is a partially cutaway oblique view of a novel superluminescent diode.

FIG. 1 is a partially cutaway oblique view of the superluminescent diode. The superluminescent diode comprises a p-type indium-phosphide (p-InP) semiconductor substrate 11 overlain by an n-type indium-phosphide (n-InP) first current blocking layer 12, which is in turn overlain by a p-InP second current blocking layer 13. A channel 14 is cut, by chemical etching for example, into the second current blocking layer 13. The channel 14 has a V-shaped cross section and is of sufficient depth to penetrate through the first blocking layer 12 into the semiconductor substrate 11. The channel 14 extends longitudinally from one facet of the diode for a certain distance into the interior, as shown in the drawing, the facet from which the channel 14 extends being the output facet of the diode.

Figure 4:
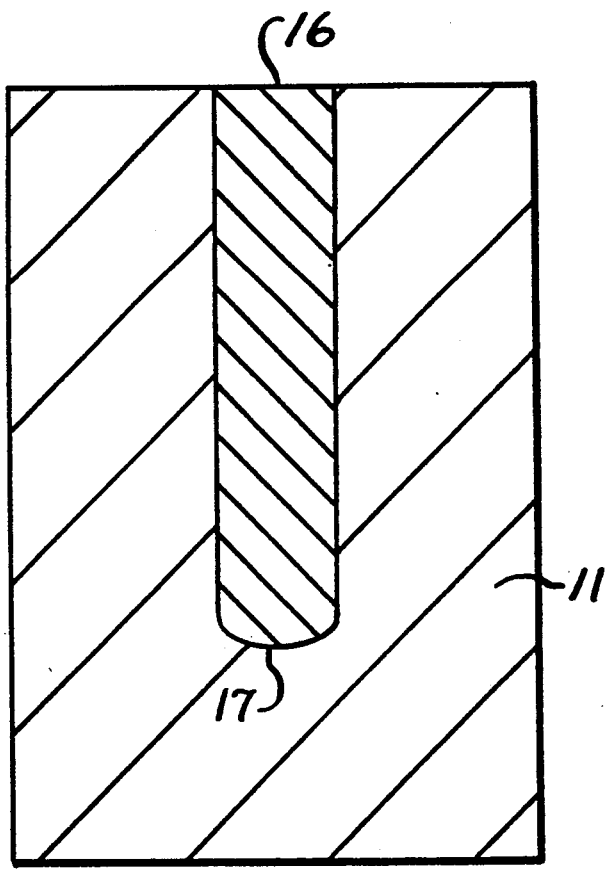
FIG. 4 is a sectional view along line I—I in FIG. 1.

A p-InP first clad layer 15 and a p-type indium-gallium-arsenide-phosphide (p-InGaAsP) active layer 16 are deposited in the channel 14, the active layer 16 being on top of the clad layer 15. At the end of the channel 14 distant from the output facet, the active layer 16 makes slanting contact with a rough diffusing surface 17 formed by the semiconductor substrate 11 and the first and second current blocking layers 12 and 13. The diffusing surface 17 can easily be created, by chemical etching for example, when the channel 14 is cut. The diffusing surface 17 can be flat. Alternatively, it can be curved. For example, it can have an arcuate shape with slanting sides as shown in FIG. 4, which makes a particularly effective diffusing surface. The diffusing surface have an inclination to the active layer 16 at an angle of 10 to 45 degrees.

The second current blocking layer 13 and the channel 14 are overlain by an n-InP second clad layer 18, which in turn is overlain by an InGaAsP cap layer 19 that makes ohmic contact with an electrode not shown in the drawing. Another electrode, also not shown, contacts the bottom of the semiconductor substrate 11.

The superluminescent diode is operated by passing a drive current between the two electrodes. In the active layer 16, the current causes a spontaneous emission of light which travels through the active layer 16 in the longitudinal direction of the channel 14, being amplified during its travel by further stimulated emission. Light traveling toward the output facet is partly emitted as a beam through the output facet and partly reflected back down the channel 14. Because the active layer is confined to the channel 14, the emitted beam has a small diameter, resulting in a high coupling efficiency into optical fiber.

Light traveling toward the opposite end of the channel 14 is reflected by the diffusing surface 17, but due to the slant of the diffusing surface 17, the light is not reflected straight back up the channel. Instead, it is diffused toward the side, the result being that the gain within the active layer 16 is insufficient for lasing to occur. The light emitted from the output facet is therefore incoherent in nature, free from optical feedback noise and other unwanted effects.

Next the output characteristics of this superluminescent diode will be described with reference to FIGS. 2 and 3. FIG. 2 shows output power vs. current characteristics and illustrates the fiber coupling efficiency. FIG. 3 shows the spectral distribution.

Figure 2:
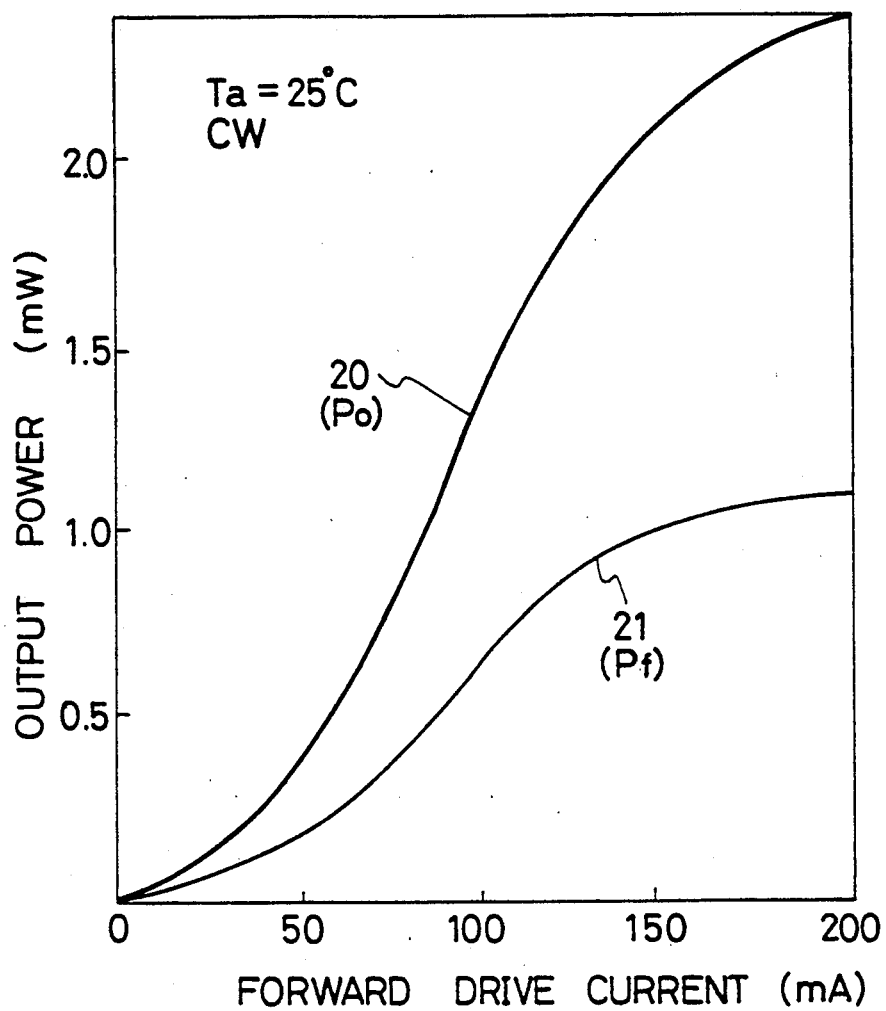
FIG. 2 illustrates the optical output and fiber output characteristics of the superluminescent diode in FIG. 1.

With reference to FIG. 2, the curve 20 indicates the optical power (Po) output by the superluminescent diode as a function of forward drive current under continuous-wave driving at an ambient temperature (Ta) of 25° C. The curve 21 indicates the optical power (Pf) output from a single-mode fiber having a hemispherical lens tip coupled to the superluminescent diode. At a forward driving current of 150 mA, for example, Po is substantially 2.2 mW while Pf is substantially 1 mW, indicating a coupling efficiency of substantially 45%. This value, even higher than the prior-art coupling efficiency into multi-mode fiber, is ample for single-mode fiber applications, including fiber-optic interference sensors.

Figure 3:
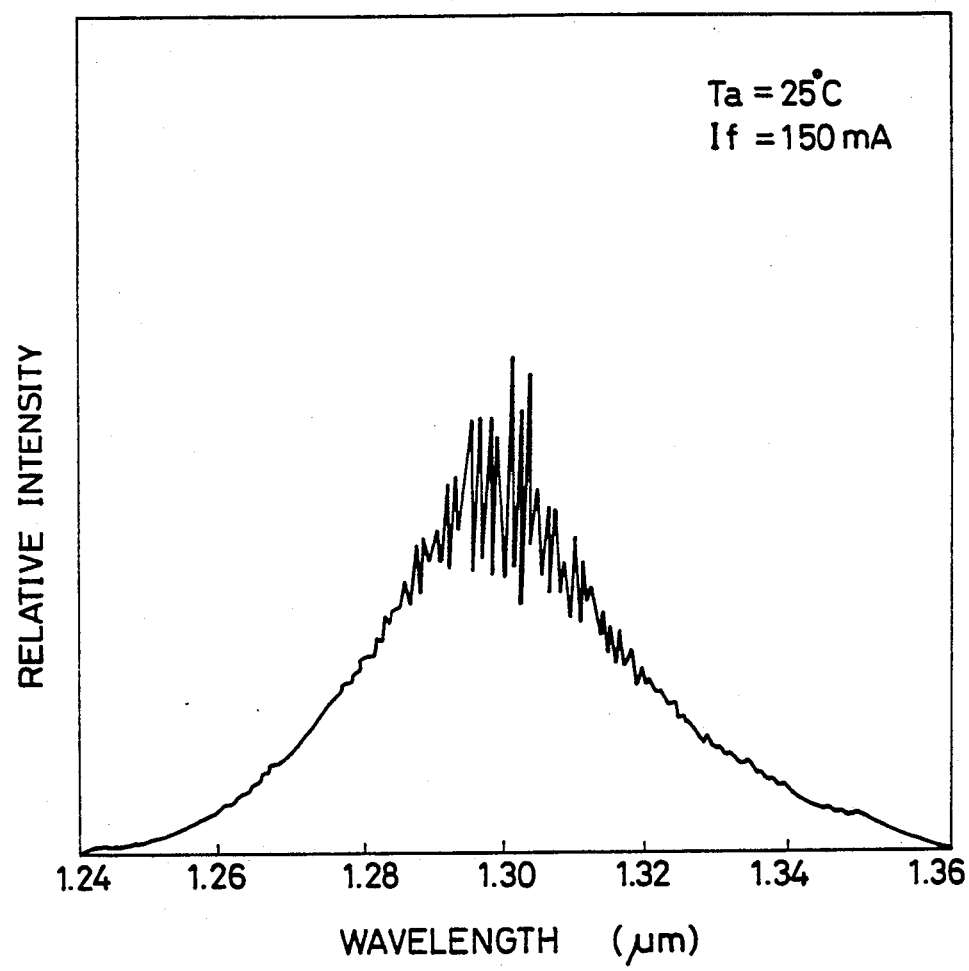
FIG. 3 illustrates the spectral distribution of the emission of the superluminescent diode in FIG. 1.

The spectral distribution of the emission at an ambient temperature (Ta) of 25° C. with a forward drive current (If) of 150 mA is shown in FIG. 3. The smooth envelope of the spectral distribution demonstrates that lasing is suppressed. The spectral half-width is 30 nm.

Thus the novel superluminescent diode can be easily and reliably manufactured, no antireflection coating being required, yet it has excellent output characteristics and displays a markedly improved coupling efficiency into single-mode fiber.

The scope of this invention is not restricted to the structure shown in FIG. 1, but includes many variations and modifications which will be apparent to one skilled in the art. For example, the superluminescent diode can comprise materials other than InP and InGaAsP. The channel need not have a V-shaped cross section; it can be U-shaped, or can have some other shape. Various modifications are also possible in the configuration of the semiconductor substrate, the current blocking layers, the clad layers, and the cap layer.

What is claimed is:

1. A superluminescent diode having an output facet for the emission of light, comprising:
   a semiconductor substrate;
   at least one current blocking layer overlying said semiconductor substrate;
   a channel, extending longitudinally from said output facet and terminating inside the diode, of sufficient depth to penetrate through said current blocking layer into said semiconductor substrate;
   an active layer, disposed within said channel, for the emission of light;
   a rough diffusing surface, formed by said semiconductor substrate and said current blocking layer or layers, which makes slanting contact with said active layer at the end of said channel distant from said output facet; and
   a current driving means for applying current to said active layer.

2. A superluminescent diode according to claim 1, wherein said channel has a V-shaped cross section.

3. A superluminescent diode according to claim 1, wherein said diffusing surface is flat.

4. A superluminescent diode according to claim 1, wherein said diffusing surface is arcuate with slanting sides.

5. A superluminescent diode according to claim 1, wherein said semiconductor substrate and said current blocking layer or layers comprise an indium-phosphide compound, and said active layer comprises an indium-gallium-arsenide-phosphide compound.

6. A superluminescent diode having an output facet for the emission of light, comprising:
   a semiconductor substrate;
   a first current blocking layer overlying said semiconductor substrate;
   a second current blocking layer overlying said first current blocking layer;
   a channel, extending longitudinally from said output facet and terminating inside the diode, of sufficient depth to penetrate through said first and second current blocking layers into said semiconductor substrate;
   a first clad layer, disposed within said channel;
   an active layer, overlying said first clad layer within said channel, for the emission of light;
   a rough diffusing surface, formed by said semiconductor substrate and said first and second current blocking layers, which makes slanting contact with said active layer at the end of said channel distant from said output facet;
   a second clad layer overlying said second current blocking layer and said active layer;
   a cap layer overlying a said second clad layer; and
   a current driving means for applying current to said active layer.

7. A superluminescent diode according to claim 6, wherein said channel has a V-shaped cross section.

8. A superluminescent diode according to claim 6, wherein said diffusing surface is flat.

9. A superluminescent diode according to claim 6, wherein said diffusing surface is arcuate with slanting sides.

10. A superluminescent diode according to claim 6, wherein said semiconductor substrate, said second current blocking layer, and said first clad layer comprise a p-type indium-phosphide compound, said first current blocking layer and said second clad layer comprise an n-type indium-phosphide compound, and said active layer comprises a p-type indium-gallium-arsenide-phosphide compound.

* * * * *